United States Patent
Furuta et al.

(10) Patent No.: US 7,394,688 B2
(45) Date of Patent: Jul. 1, 2008

(54) NONVOLATILE MEMORY

(75) Inventors: Hiroshi Furuta, Kanagawa (JP); Kiyokazu Hashimoto, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 8 days.

(21) Appl. No.: 11/144,792

(22) Filed: Jun. 6, 2005

(65) Prior Publication Data
US 2005/0270842 A1 Dec. 8, 2005

(30) Foreign Application Priority Data
Jun. 8, 2004 (JP) ............................. 2004-169587

(51) Int. Cl.
*G11C 11/34* (2006.01)
(52) U.S. Cl. .............. 365/185.09; 365/200; 365/230.03
(58) Field of Classification Search ............ 365/185.09, 365/200
See application file for complete search history.

(56) References Cited

U.S. PATENT DOCUMENTS

| | | | | |
|---|---|---|---|---|
| 5,359,570 A | * | 10/1994 | Hsu et al. .............. | 365/185.09 |
| 5,377,147 A | * | 12/1994 | Merchant et al. ....... | 365/185.09 |
| 6,144,592 A | * | 11/2000 | Kanda ........................ | 365/200 |
| 6,556,479 B2 | * | 4/2003 | Makuta et al. ......... | 365/185.09 |
| 6,728,133 B2 | * | 4/2004 | Shimizu ................. | 365/185.03 |
| 6,728,910 B1 | * | 4/2004 | Huang ........................ | 714/711 |
| 2003/0086319 A1 | * | 5/2003 | Fujimoto et al. ............. | 365/200 |
| 2004/0237023 A1 | * | 11/2004 | Takahashi et al. ........... | 714/768 |

FOREIGN PATENT DOCUMENTS

JP 09-320289 12/1997

* cited by examiner

*Primary Examiner*—Huan Hoang
*Assistant Examiner*—Anthan T Tran
(74) *Attorney, Agent, or Firm*—Young & Thompson

(57) ABSTRACT

The memory device according to an embodiment of the invention prepares a reference field (reference value range) corresponding to each logical value and if the threshold value of the cell is within that field, the cell is determined to be defective and the data of the defective cell is stored in a redundant cell. Therefore, if the threshold value drops because the cell charge leaks over time, the data which is stored can be rescued. As a background operation of a normal operating, memory device performs the memory cell check and memory cell substitution in accordance with the internal addresses generated independently than external addresses. Therefore, a defective cell can be rescued without causing delay in the normal operations of memory device.

13 Claims, 17 Drawing Sheets

|    | SC01 | SC02 | SC03 | SC04 | SC05 | SC06 | ERROR |
|----|------|------|------|------|------|------|-------|
| 00 | L | L | L | L | L | L |   |
| 01 | H | H | L | L | L | L |   |
| 10 | H | H | H | H | L | L |   |
| 11 | H | H | H | H | H | H |   |
| a  | H | L | L | L | L | L | 00ERROR |
| b  | H | H | H | L | L | L | 01ERROR |
| c  | H | H | H | H | H | L | 01ERROR |

FIG. 11A

NONVOLATILE MEMORY

BACKGROUND OF THE INVENTION

1. Field of the Invention

The present invention relates to a nonvolatile memory, and more particularly to a nonvolatile memory which stores data from a memory cell in which an error is detected, in a redundant cell (reserved cell).

2. Description of the Related Art

Nonvolatile semiconductor memory such as EEPROM and flash memory can be electrically erased or written over, and because the data is not deleted even though the power is turned off, these devices are used in many applications such as portable phones, digital cameras, and personal computer BIOS memory or the like. With this type of nonvolatile semiconductor memory device, a charge is accumulated in a memory cell floating gate and data is stored by changing the cell threshold value. In order to read the data, a current is supplied to the cell, and the data stored in the memory cell can be read by detecting the current value (or threshold value thereof).

When memory cells become smaller in conjunction with miniaturization, the amount of charge (generally the number of electrons) accumulated in the floating gate is reduced. The number of electrons accumulated at the floating gate can simply be expressed by the following equation. If only ΔVFG is changed by the influx (efflux) of electrons by the electric potential of the floating gate, the number of influx (efflux) electrons of the floating gate is expressed by the following equation.

$$N = (1/e) \times CFG \times \Delta VFG$$

In this equation, CFG is the capacity of the floating gate, and has a proportional relationship to the floating gate electrode size L×W.

$$CFG \propto L \times W$$

In conjunction with miniaturization, CFG is reduced, and the width of ΔVFG, which is used for the logical determination, become smaller by reducing the voltage and making multi-valued. Prior to use, (particularly when using as ROM), the number of electrons in the floating gate will be reduced, and if a threshold voltage (flag) that is used for a specific logical determination is exceeded, wrong information will be stored. Therefore, when this cell is "read", the mistaken data will be read and a "software error" will occur. It is thought that this type of phenomenon will become more marked in multi-value cells where the threshold value which makes a prescribed logical determination is narrow.

Methods to rescue data from defective cells are known where the defective cells are rescued by so-called redundancy circuits which are performed prior to shipping the product. However, software errors caused by the reduction in the number of electrons at the floating gate during use as described above can not generally be detected prior to shipping the product. Furthermore, methods to determine defective cells using ECC (Error Check Correct) process and then to restore the properties of the cell, are widely known. However, ECC process requires a fair amount of process time so normal operation of the memory device is delayed. Furthermore, an ECC circuit must be added in order to perform ECC process, which leads to increased chip area.

On the other hand, a change in the threshold voltage because of a change in the number of electrons of the aforementioned floating gate was highlighted in patent literature 1. In nonvolatile memory, a change in the data can occur during use because of "data leak" where an electric charge passes slowly through an oxide film. Therefore, nonvolatile memory which better prevents storage data conversion by shifting the threshold value of the transistor has been proposed in Japanese Patent Application Laid-open No. H9-320289.

These proposed semiconductor nonvolatile memory devices, in order to read the data, determine whether or not a pre-charged bit line voltage (VBL) is between a reference level VL and a middle level VM, or between a reference level VH and a middle level VM, and rewrite "1" or "0" in the memory cell where the data was read. Therefore, problems with inverting of stored data can be prevented beforehand by a shift in the cell transistor threshold value.

It has now been discovered that, with the aforementioned conventional semiconductor nonvolatile memory, changing of the stored data caused by a reduction in the number of electrons at the floating gate can be prevented. However, there is variation in the degree of the reduction of the number of electrons at the floating gate, depending on the cell. Generally, cells which have a large reduction in the number of electrons will again have a large reduction in the number of electrons after the data is rewritten. Therefore, the inefficient rewriting of the data to the same cell must be repeatedly performed.

Furthermore, with this conventional technique, cell checking and rewriting is performed while the CPU is not accessing the EEPROM such as when the power is turned on or when the system is shut down. Therefore, the frequency of cell check is limited, and there are cases where each cell cannot be inspected at the necessary frequency.

SUMMARY OF THE INVENTION

According to an aspect of the invention, there is provided a nonvolatile memory comprising a memory cell array storing data and accessed with an external address, an internal address generation circuit generating an internal address different from an external address, a check circuit performing a check process comprising detection and determination of state of a cell selected with an internal address during an access cycle from an external circuit to the memory cell array, and a redundant cell storing data of the selected cell if the check circuit determines that the cell state is within a predetermined range.

Since the check circuit performs a check process comprising detection and determination of state of a cell selected with an internal address during an access cycle from an external circuit to the memory cell array, software errors caused by cell state changes in the nonvolatile memory can be prevented without degrading the performance of the nonvolatile memory.

BRIEF DESCRIPTION OF THE DRAWINGS

The above and other objects, advantages and features of the present invention will be more apparent from the following description taken in conjunction with the accompanying drawings, in which:

FIGS. 11A-11B are diagrams showing the circuit configuration of the encoder of the present embodiment, and the relationship between the output signals from the comparator detectors and the cell state of the memory cell;

DESCRIPTION OF THE PREFERRED EMBODIMENTS

Embodiment 1

Figure 1A:
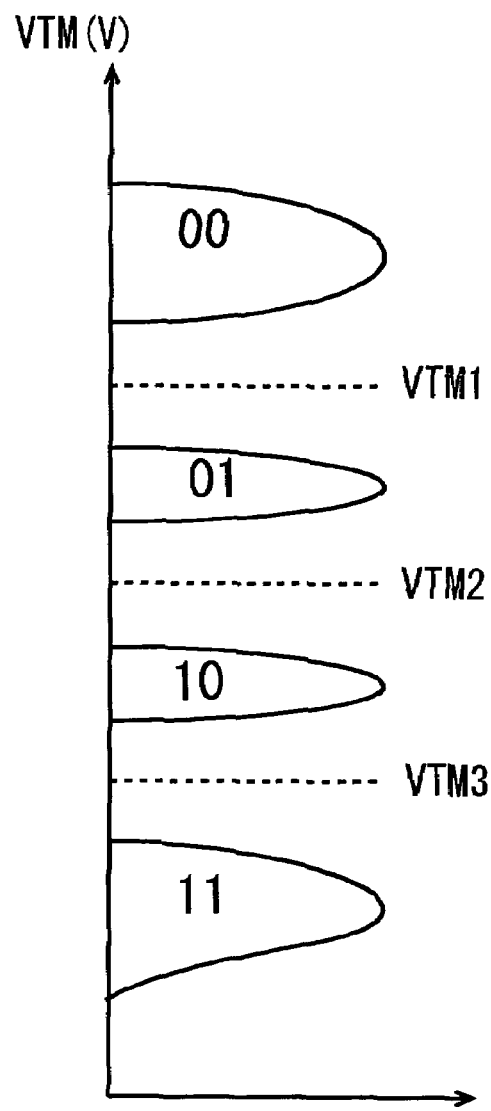
FIGS. 1A-1B show a reference value for determining the threshold value distribution and the logical values for a 4-value cell for the present embodiment.
Figure 1B:
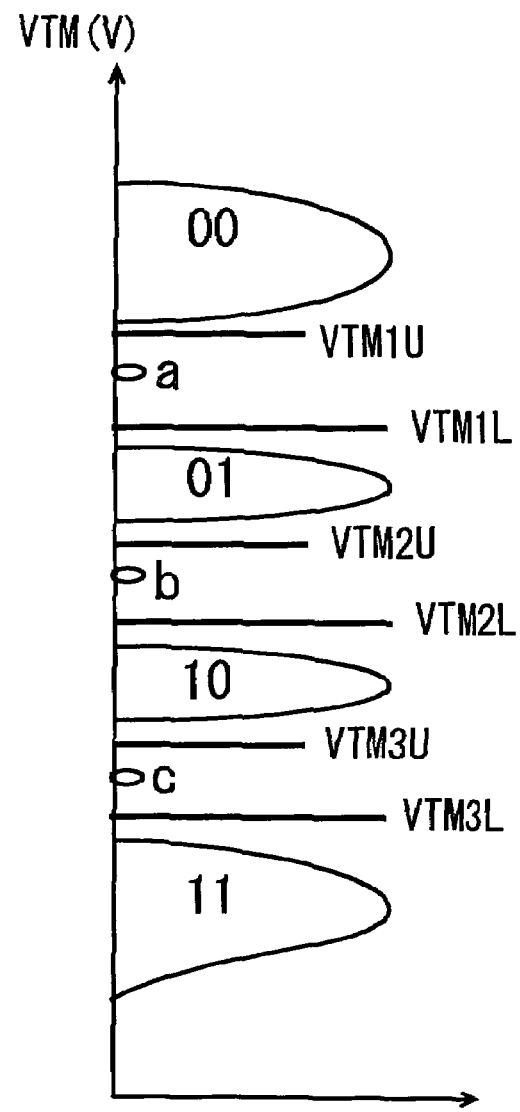

With the flash memory of this embodiment, cells with defective charge retention are detected, and the defective cells or the data stored in the defective cells are rescued by storing data stored in the defective cells in redundant cells (reserved cells). First, the method of the present embodiment for determining retention defective cells will be described referring to FIGS. 1A-1B. Note, hereinafter, an example where four pieces of data are stored in each multi-value cell will be described. FIG. 1A shows a reference value (VTM(k)) for determining each logical value and a threshold value distribution (transistor threshold voltage) for a 4 value cell in a flash memory. FIG. 1B similarly shows a reference value (VTM(k)) for determining each logical value and a threshold value distribution for a 4 value cell in the flash memory of the present embodiment. The Y axis in each of the figures shows the cell threshold value, and the X axis shows the number of cells. The threshold value of the cells which correspond to the logical values has a variance.

With reference to FIG. 1A, the logical value of each cell can be determined by comparing the threshold value of each cell and a reference value VTM. For instance, in the example of FIG. 1A, VTM>VTM1 is determined to have a logical value of "00", VTM1>VTM>VTM2 a logical value of "01", VTM2>VTM>VTM3 a logical value of "10", and VTM3>VTM a logical value of "11".

In this case, the cell charge will leak over time, such that the threshold value of the retention defective cell will shift to the threshold value designated by "a", "b", or "c" in FIG. 1B. The threshold value of the cell with a logical value of "00" can be presumed to change to "a", the threshold value of the cell with the logical value of "01" to change to "b", and the threshold value of the cell with the logical value of "10" to change to "c". The memory device of this embodiment compares the threshold value of each cell to a reference value, and cells which have a threshold value within a specific range are determined to bed efective cells, and the data is then stored in a redundant cell.

As shown in FIG. 1B, the determination of defective cells can be made using six reference values. The six reference values consists of three reference value pairs with different values (VTM (k) L, VTM (k) U), and a cell which have a threshold value between a specific reference value pair is determined to be defective cell with a logical value which correspond to the specific reference value pair. Specifically, If VTM1U>VTM>VTM1L, the cell is determined to be a defective cell with a logical value of "00", if VTM2U>VTM>VTM2L, the cell is determined to be a defective cell with a logical value of "01", and if VTM3U>VTM>VTM3L, the cell is determined to be defective cell with a logical value of "10".

Thus, the memory device of the present embodiment prepares a reference field (reference value range) corresponding to each logical value and if the threshold value of the cell is within that field, the cell is determined to be defective and the data of the defective cell is stored in a redundant cell. Therefore, if the threshold value drops because the cell charge leaks over time, the data which is stored can be rescued. Next, several configurations will be described referring to the drawings.

Figure 2:
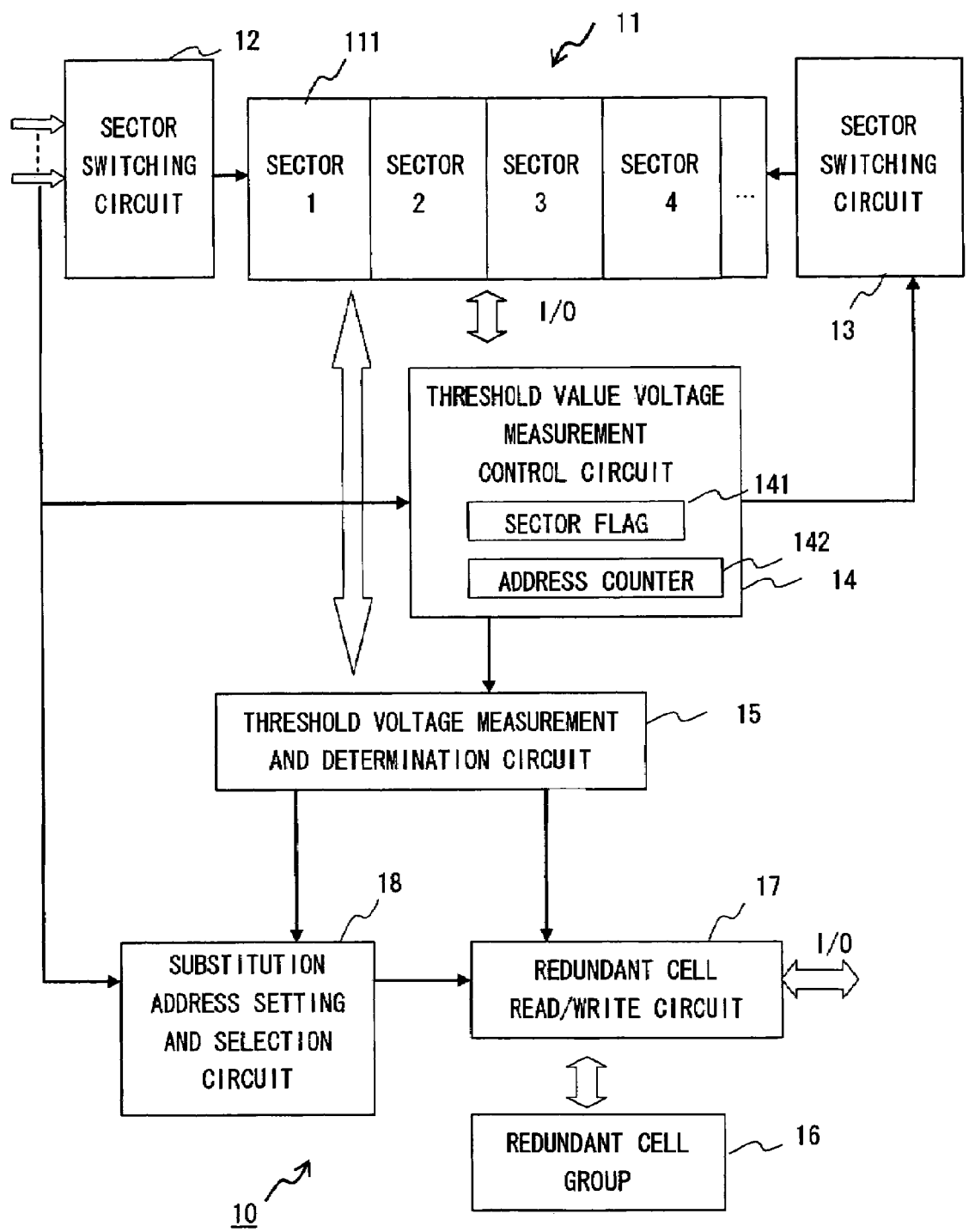
FIG. 2 is a block diagram showing a summary configuration of the memory device of one embodiment of the present invention.

FIG. 2 is a schematic block diagram showing the configuration of a memory device according to an embodiment of the present invention. FIG. 2 shows characteristic structural elements and related structural elements of a memory device 10, and a description for various standard components such as the data read/write circuits of the memory cell array is omitted for clarity of explanation. As a background operation of a normal operating, memory device 10 performs the memory cell check and memory cell substitution in accordance with the internal addresses generated independently than external addresses. Therefore, a defective cell can be rescued without causing delay in the normal operations of memory device 10. Specifically, defective cell rescue process is carried out during the writing process cycle to memory cell array 11. Memory device 10 is flash memory, so the writing process includes erasing and data programming (data writing) in the specified memory area.

Memory cell array 11 comprises a plurality of sectors 111 (4 sectors are shown in FIG. 2 as an example). In the read/write process of memory cell array 11, Memory cell array 11 is accessed on a sector to sector basis. In the writing process, data deletion and data programming are performed in the sector 111 selected by the sector switching circuit 12 during the E (Erase)/W (Write) process.

The memory cell check is performed on each sector selected by the sector switching circuit 13 during Vt (threshold value) check. In this embodiment, during the write cycle, cell check is performed in a different sector than the sector where writing is being performed. Furthermore, check is performed during each write cycle. During Vt checking, the sector switching circuit 13 selects the sector to be checked based on a control signal from a threshold value voltage measurement control circuit 14. The threshold value voltage measurement control circuit 14 determines if write access is being carried out based on external commands, and if writing process is being performed, the defective cell check process will be performed. Furthermore, the threshold value voltage measurement control circuit 14 acquires the writing process address data from the outside and determines the sector to be subject to the check based on that address. Sectors to be checked are selected from sectors different than the sector being accessed in the writing process in order to prevent conflicts with normal operations.

The memory cell check is preferably performed on all of the memory cells in one or a plurality of sectors 111 during a single write cycle. Therefore, error cell check and data substitution can efficiently be performed for the memory device which is accessed by each sector. The threshold voltage measurement control circuit 14 comprises a sector flag 141, and records the last check completed sector (or a sector which should be checked next). In the next check, the check sector will be selected and decided by the sector ID recorded in the sector flag 141.

Sectors and memory cells in each sector will be uniformly checked in the memory cell array 11 check. Specifically, each sector can be uniformly checked by successively checking the memory cells of each sector according to the sector ID recorded in the sector flag 141. The threshold voltage measurement control circuit 14 comprises an address counter 142, and the address of the cell to be checked is sequentially designated by this address counter 142. The checked cells are accessed in accordance with the internal addresses generated separately from the external addresses for normal operation.

The memory cell threshold voltage measurement and error cell determination are performed by the threshold voltage measurement and determination circuit 15. The threshold voltage measurement and determination circuit 15 measures the threshold voltage of the checked cell and determines if the measured threshold value is within a predetermined reference voltage range by comparing to a reference value. If the checked cell falls within the predetermined reference voltage range, the cell will be determined to be an error cell. The determination method for the threshold voltage measurement and determination circuit 15 is as described above with reference to FIGS. 1A, 1B. Furthermore, the threshold value voltage can be determined by measuring this cell current. This point will be described later on. The threshold voltage measurement and determination circuit 15 measures the threshold voltage of the memory cell and determines if the memory cell is a defective cell using the address acquired from the threshold voltage measurement control circuit 14.

If the memory cell is determined to be a defective cell by the threshold voltage measurement and determination circuit 15, the data stored in the defective cell will be recorded in a redundant cell of the redundant cell group 16. The threshold voltage measurement and determination circuit 15 determines the proper logical value of the defective cell and outputs to the redundant cell read/write circuit 17 an internal address which designates the address of the redundant cell and the logical data. The redundant cell read/write circuit 17 writes the logical value data to the designated address. Each redundant cell of the redundant cell group 16 preferably stores one bit of data. Therefore, the occurrence of defective cells in the redundant cells can be limited. In this example, four values were recorded in one memory cell. Therefore, the redundant cell group 16 can record the logical value of each memory cell by recording two bit data in one address.

If the data of memory cell array 11 is substituted into redundant cell group 16, the external address which designates the memory cell in the read operation must be replaced with a redundant cell address (substitution address) which designates the redundant cell. A substitution address setting and selection circuit 18 acquires an external address and corresponding substitution address from the threshold value voltage measurement and determination circuit 15, and sets up the address. Furthermore, if a read access is made for the defective cell, the external address will be changed to the corresponding substitution address.

The substitution address which was converted by the substitution address setting and selection circuit 18 is input to the redundant cell read/write circuit 17. The redundant cell read/write circuit 17 reads the requested data from the redundant cell group 16 in accordance with the input substitution address that was input, and outputs to the data bus (not shown in the drawings). The data is externally output through an input/output circuit (not shown in the drawings). The logical value of the memory cell can be changed by data writing, so the substitution address setting and selection circuit 18 clears or resets the substitution address if data delete and data programming in the sector 111 are performed.

Note with flash memory, the check process is preferably performed during the writing process cycle which accompanies the data deletion, but it is also possible to perform the check during the read process.

The threshold voltage measurement and determination circuit 15 can check the memory cell array in a predetermined address order and resume the check processing from an address next to a checkcompleted address if the check processing is suspended.

Embodiment 2

Figure 3:
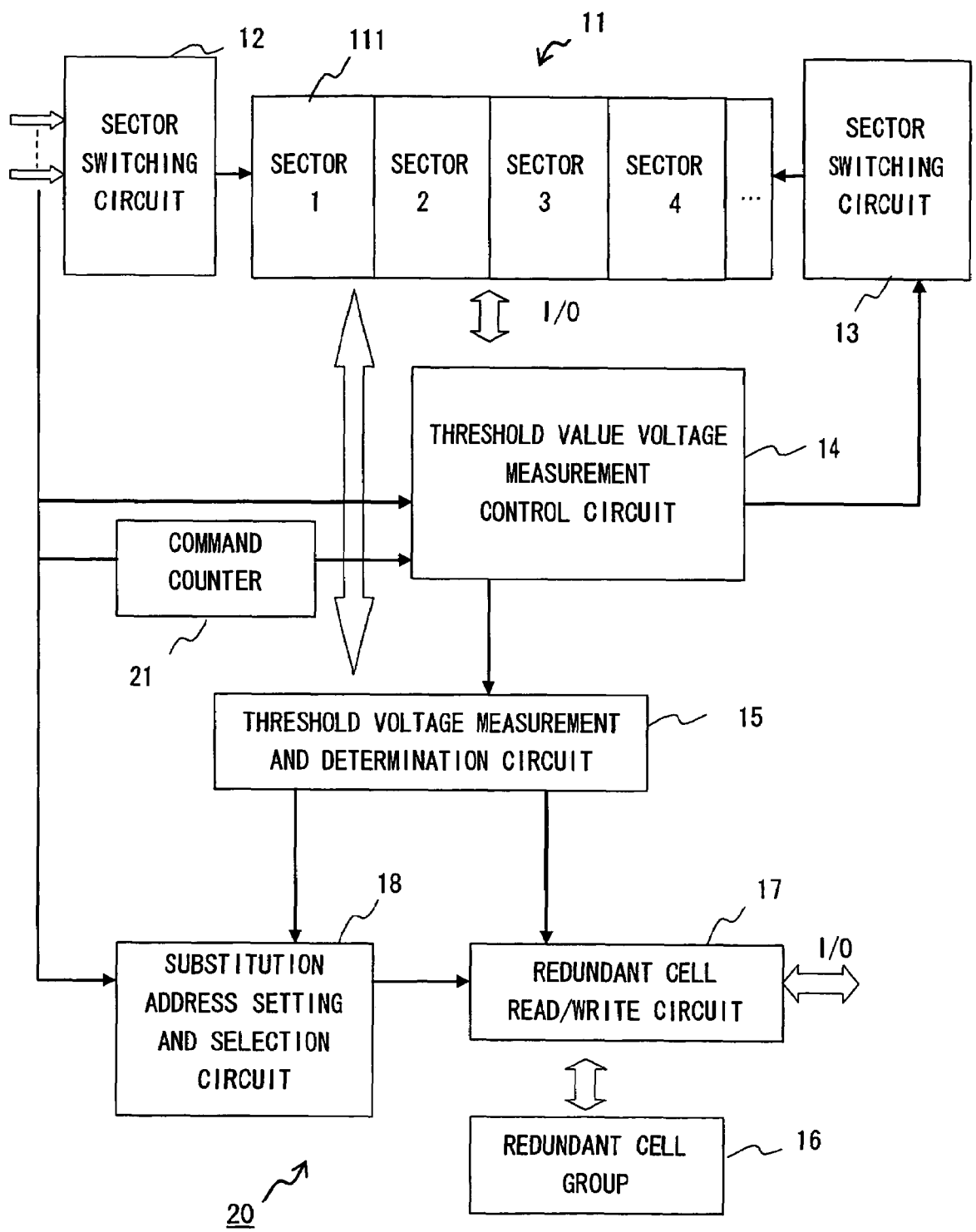
FIG. 3 is a block diagram showing a summary configuration of the memory device of another embodiment of the present invention.

FIG. 3 shows another embodiment of the memory device of the present invention. In the above example, defective cell check and substitution was performed for each data writing cycle to the memory cell array 11. The memory cell is accessed during the defective cell check. Therefore, from the viewpoint of reducing the load on the memory cell and reducing power consumption, checking for defective cells at a specified interval is preferable. Memory device 20 of the present embodiment checks defective cells each time a designated number of reads or writes processes are performed. Therefore, additional load on the memory cell and additional power consumption can be limited while still performing the necessary defective cell rescues.

Memory device 20 comprises a command counter 21. The command counter 21 counts the number of read commands and write commands issued (number of command acquisitions) to the memory cell array 11. The counted data is input to the threshold voltage measurement control circuit 14. The threshold voltage measurement control circuit 14 has predetermined values for both the number of read commands and write commands. If either one of the read commands or write commands reaches this predetermined value, the threshold voltage measurement control circuit 14 will performs checking for defective cells in the memory cell array 11.

If the memory device 20 is primarily used for reading data such as with ROM, or if data writing is performed frequently, the use of various different forms is possible. By inspecting based on the number of both read and write commands, inspecting for defective cells can be performed within a designated period of time for memory devices which can be used in a variety of applications. Other than the above construction, designs which are essentially the same as memory device 10 will be described while referring to FIG. 2.

Figure 4:
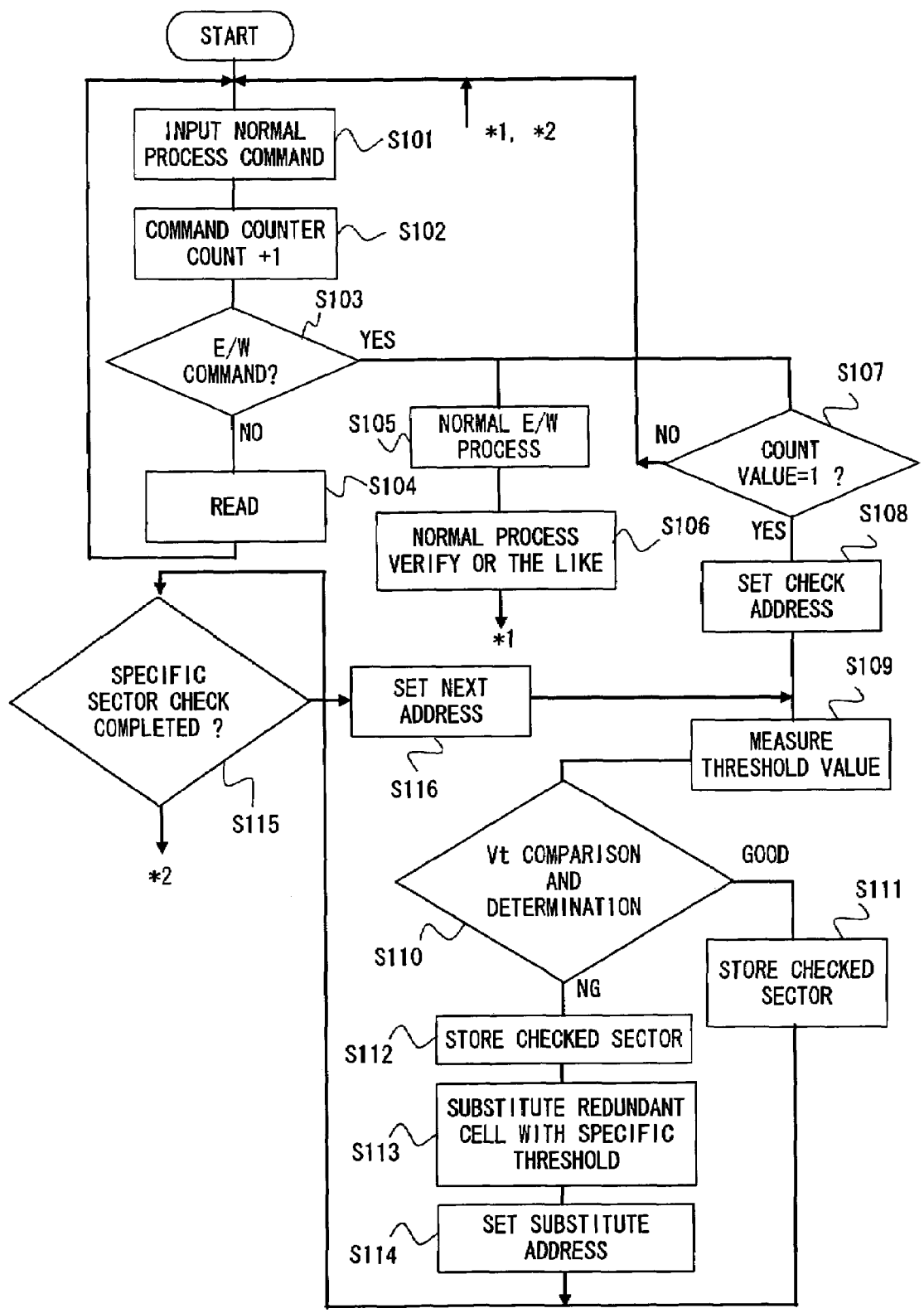
FIG. 4 is a flowchart of a memory device check process described in reference to FIG. 3.
Figure 5:
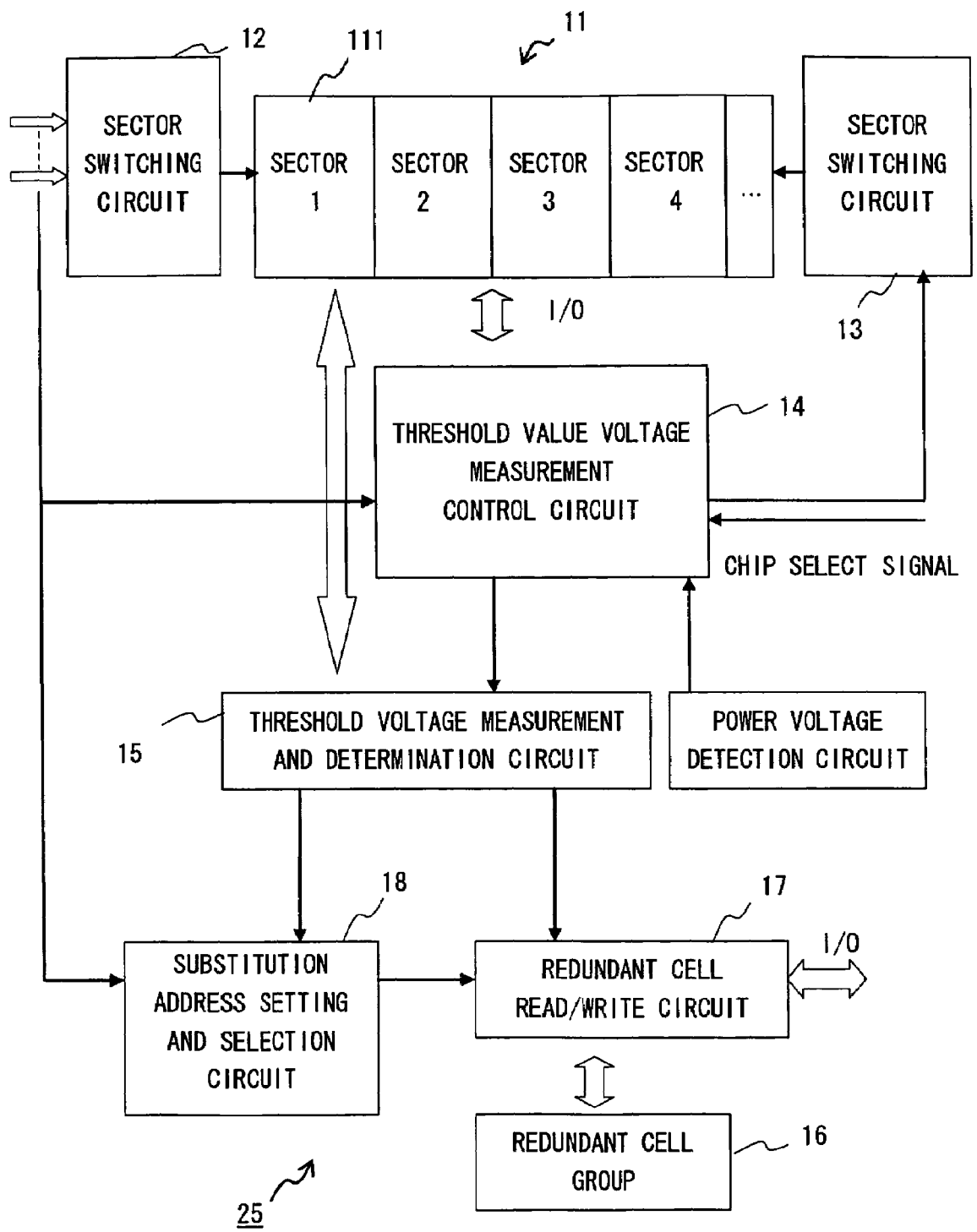
FIG. 5 is a block diagram showing a summary configuration of a memory device of another embodiment of the present invention.

The check operation for the memory device 20 will be described while referring to the flowchart of FIG. 4. Note, first, a normal external read or write command is input (S101). The command counter 21 increases the count by 1 depending on the input command (S102) The threshold voltage measurement control circuit 14 acquires a process command and determines whether or not the process is a writing process (S103). If the process is a read process rather than a writing process, the read process will be executed for the memory cell array 11 (S104). If the process is a writing process, normal writing will be performed. Data deletion and data programming are performed at a designated field (S105). Furthermore, a verify process may be performed if necessary (S106).

In parallel with a normal writing process, the check for defective cells is performed as a background process. The threshold voltage measurement control circuit 14 acquires the counted number from the command counter 21 and determines whether the number of read commands or write command is at the predetermined value N (S107). If the level of N is not met, the check process will not be performed, and the system waits for the next command input. If the number of read commands or write commands is at the predetermined value N, the threshold voltage measurement control circuit 14 sets the memory cell address (check address) to be inspected by the threshold voltage measurement and determination circuit 15 (S108). The threshold voltage measurement and determination circuit 15 measures the memory cell threshold value of the check address (S109). Furthermore, the defective cell determination is performed by comparing to a reference value (S110).

If the cell is determined to not be defective, the inspected sector is recorded by the sector flag (S111). If a cell is determined to be defective, the inspected sector is recorded by the sector flag (S112), and the data from the defective cell is recorded to a designated address in a redundant cell group 16 by the redundant cell read/write circuit 17 (S113). Furthermore, the substitution address of the redundant cell group which corresponds to the memory cell address is set by a substitution address setting and selection circuit 18 (S114). Next, a decision is made of whether or not the check in the specified sector is complete (S115), and if not complete, the next address will be set (S116), and the check continued, but if completed, the checked process will terminate.

Note, the memory device 20 of the present embodiment counts the number of read commands and write commands, and if either one reaches a predetermined value, the defective cell checked will be performed, but it is also possible to count only one of the read or write commands and to perform the defective cell check based on that count. The predetermined values for the different commands can be identical or different values.

Embodiment 3

In the above embodiment, the defective cell check process is performed depending on the number of acquired commands. However, depending on the memory device, access to the memory cell array may be extremely limited. In these cases, a situation can be imagined where the memory cell array check is not carried out within the necessary time period. The memory device of this embodiment inspects the main cell array when the memory device is powered on or when the memory device is selected and activated by a control signal after it is turned on. Therefore, the memory cell threshold value can be prevented from changing to a different logical value range.

The memory device 25 comprises a power voltage detection circuit 26. The power voltage detection circuit 26 detects whether or not the power voltage of the memory device 25 is above a reference value, and if the power is detected to be ON, the threshold voltage measurement control circuit 14 will receive a control signal. If the power voltage detection circuit 26 detects that the power is on, the threshold voltage measurement control circuit 14 will start inspecting the memory cell array 11 depending on the signal from the power voltage detection circuit 26. Check of the memory cell array 11 is identical to the other aforementioned embodiments, so the description will be omitted. When the power is ON, the defective cell check will be performed on the cells of a designated sector number or on all of the sectors of the memory cell array 11.

In the present embodiment, the threshold voltage measurement control circuit 14 also performs check based on a chip select signal. Specifically, when the chip select signal is selected and the memory device 25 is detected to be activated, the threshold voltage measurement control circuit 14 begins the memory cell array 11 check similar to when the power is turned ON. The check method is the same as when the power is turned ON. Note, the memory device 25 may also perform check of the memory cell array 11 either when the power is turned ON or when activated. Alternatively, the structure of the present embodiment may also be a combination of other embodiment structures. The check timing and frequency can be selected to be optimal for the memory device in accordance with the design.

Embodiment 4

The detailed structure of a preferred embodiment of a memory device of the present invention will be described. The detailed structure of an embodiment corresponding to the memory device 10 described in Embodiment 1 will be described below. A sector (SEC0) 111 of the memory cell array 11 is displayed in FIG. 6. The sector 111 comprises a main cell field (MC0) 112 which comprises multiple memory cells. Furthermore, the sector 111 also comprises the redundant cell field (RC0) 113 which stores the data from the defective cell of the main cell field 112.

Reading and writing data to the main cell field 112 is performed through a read/write circuit (SW0) 114. The read/write circuit 114 accesses the main cell field 112 in accordance with addresses specified by an X decoder (XDEC) 115, a Y decoder (YDEC) 116, a Y selector (YSEL) 117, and a sector decoder (SDEC) 131.

Furthermore, data read/write to the redundant cell field 113 is performed through a redundant cell read/write circuit (RSA/RWC) 118. The redundant cell read/write circuit 118 accesses the redundant cell field 113 in accordance with addresses specified by a redundant cell X decoder (RXDEC) 119, a redundant cell Y decoder (RYDEC) 120, a redundant cell Y selector (RYSEL) 121, and a sector decoder (SDEC) 131. Each of the decoders and the read/write circuit are supplied with a high-voltage from a high-voltage generating circuit (PUMP) 130 in order to delete and write data.

Figure 6:
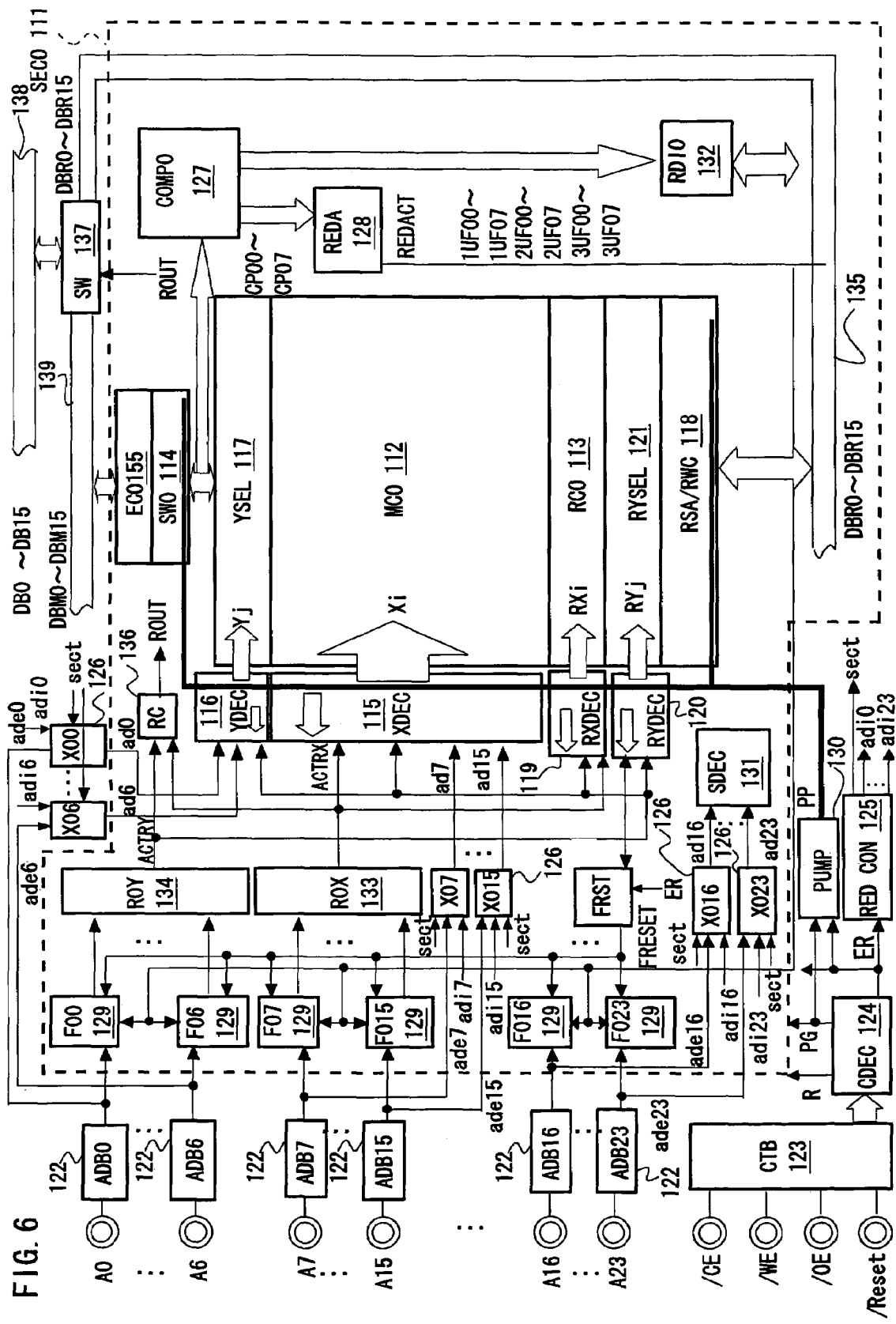
FIG. 6 is a diagram showing an example of a detailed configuration corresponding to the memory device described in reference to FIG. 2.

First, the structure relating to the defective cell check and the defective cell data substitution during the write cycle will be described. Address data and control data are input to the memory device from the outside. In FIG. 6, the double lines show an input/output terminal for external data. The address data (A0-A23) is buffered in an address buffer (ADB0-ADB23) 122. Furthermore, the control data from the outside is buffered in a control input buffer (CTB) 123. A chip select signal CE, a write enable signal WE, an output enable signal OE, and a reset signal Reset or the like are shown as examples of control signals from the outside.

The command decoder (CDEC) 124 acquires the control data from the control input buffer 123, and determines whether or not the access is a writing process (delete/program). If determined to be a writing process, the command decoder 124 sets the output signal ER to level H. The output signal ER is input to a redundant cell control circuit (RED-CON) 125. The redundant cell control circuit 125 determines whether or not the checked sector matches the access sector using an external address. The redundant cell control circuit 125 records the sector ID which internally specifies the next sector to be inspected, and thereby makes a determination.

The redundant cell control circuit 125 sets the sect signal to level H if the sectors do not match. Furthermore, the redundant cell control circuit 125 also generates and outputs an internal address (adi0-adi23) which specifies a checked cell. A background read is performed in order to inspect for defective cells in accordance with this internal address. On the other hand, if the sectors do not match, the redundant cell control circuit 125 sets the sect signal to level L. Furthermore, an internal address is not generated and background reading is prohibited.

The sect signal and the internal address (adi0-adi23) are input to the external address (ade)/internal address (adi) switching circuit (X00-X23) 126. The external address/internal address switching circuit 126 switches the addresses depending on the sect signal, and outputs an address (ad0-ad23). If the sect signal is at level H and a background read directive is made, the external address/internal address switching circuit 126 selects and outputs an interval address. Note, during normal operation, the external address/internal address switching circuit 126 selects and outputs an external address.

When the inspecting process is performed, the selectively output internal address (ad0-ad23) is input to the main cell field 112 decoders 115, 116, 131, and the memory cell of the designated address is selected. A read determination circuit (COMO) 127, which reads the signal from the selected cell, determines the cell state of the selected cell. Specifically, the read determination circuit (COMO) 127 measures the threshold voltage of the cell by detecting the cell current and by comparing to a reference value, and determines whether or not the threshold value is at one of the levels "a", "b", or "c", which were described in reference to FIGS. 1A-1B.

If the threshold value of the inspected cell is in any of the aforementioned ranges, the cell is determined to be a defective cell and a redundant cell activation control circuit (REDA) 128 outputs a READACT signal in accordance with control signals (CP00-CP07) from the read determination circuit 127. If the cell is determined to be defective, the READACT signal is set to level H. Fuses (F00-F23) 129 record the internal address (internal address which is the address of the main cell field 112) in accordance with the READACT signal. Furthermore, the data of this address is recovered by a data recovery circuit (RDI0) 132. The data recovery circuit 132 performs data recovery in accordance with the signal (1UF00-07, 2UF00-07, 3UF00-07) from the read determination circuit 127. The data is then written to the designated address of redundant cell field 113 by the redundant cell read/write circuit 118.

Note, the fuse 129 is set by the output signal FREST of the fuse reset circuit (FRST) and clears the recorded data before the field which includes the address being recorded is deleted.

Next, components for reading the substituted data in the redundant cell field 113 will be described. In read mode, when the external addresses (ade0-ade23) are input, the RXDEC access circuit (ROX) 133 and the RYDEC access circuit (ROY) 134 compare and determined whether or not the address recorded by the fuse 129 matches the external address. If the addresses do not match, normal reading will be performed from the main cell field 112.

If the addresses do match, the redundant cell X decoder 119 and the redundant cell Y decoder 120 will be activated in accordance with the respective control signals ACTRX and ACTRY from the RXDEC access circuit 133 and the RYDEC access circuit 134. The redundant cell read/write circuit 118 reads the data from the specific redundant cell selected by the control signals ACTREX, ACTRY, and outputs the data to a redundant cell internal bus (DBR0-DBR15) 135. A redundant cell access circuit (RC) 136 outputs a control signal ROUT in accordance with the respective control signals ACTRX, ACTRY from the RXDEC access circuit 133 and the RYDEC access circuit 134.

A bus switching circuit (SW) 137 switches the output to an input/output data bus (DB0-DB15) 138. If the data from the main cell field 112 has been read, the main cell input/output data bus (DBM0-DBM15) 139 will be selected. If the data from the designated address of the redundant cell field 113 is read as described above, the bus switching circuit 137 will select the redundant cell internal bus 135 based on the control signal ROUT from the redundant cell access circuit 136.

The detailed structure of several of the component elements of the memory device described while referring to FIG. 6 will be described below.

Redundant Cell Control Circuit (REDCON) 125

Figure 7:
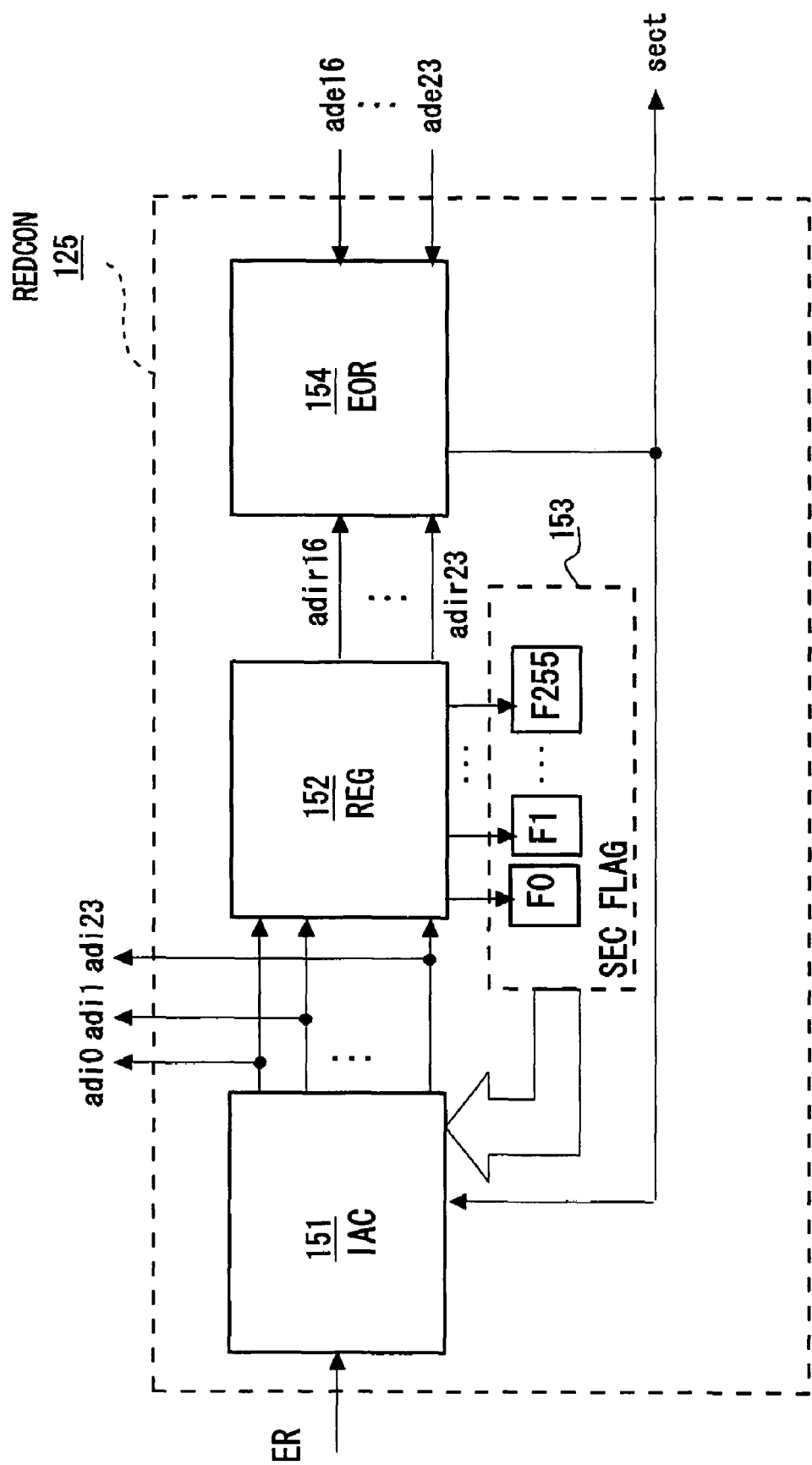
FIG. 7 is a block diagram showing the redundant cell control circuit (REDCON) structure for the present embodiment.

FIG. 7 is a block diagram showing the structure of the redundant cell control circuit (REDCON) 125. The redundant cell control circuit 125 comprises an internal address counter (IAC) 151 which generates an internal address for cell check, a register (REG) 152, sector flags (F0-F255) 153 which record the sectors which have been inspected, and a determination circuit unit (EOR) 154 which determines whether or not the delete/write sector and the checked sector match.

The internal address counter 151 successively increments and outputs an internal address which specifies the checked cell, based on the ER signal. The internal address is output to the other circuit components and recorded in the register 152. The determination circuit unit 154 compares the address (ade16-23) which designates a sector in the external address with the internal address (adir16-23) which is output from the register 152, and determines whether or not the two sectors match. The determination circuit unit 154 outputs "L" if the sectors match, or "H" if the sectors do not match, as the control signal sect. If the sector flags 153 are all 1, the internal addresses will all be reset.

Encoder Circuit 155 and Read/Write Circuit 114

Figure 8:
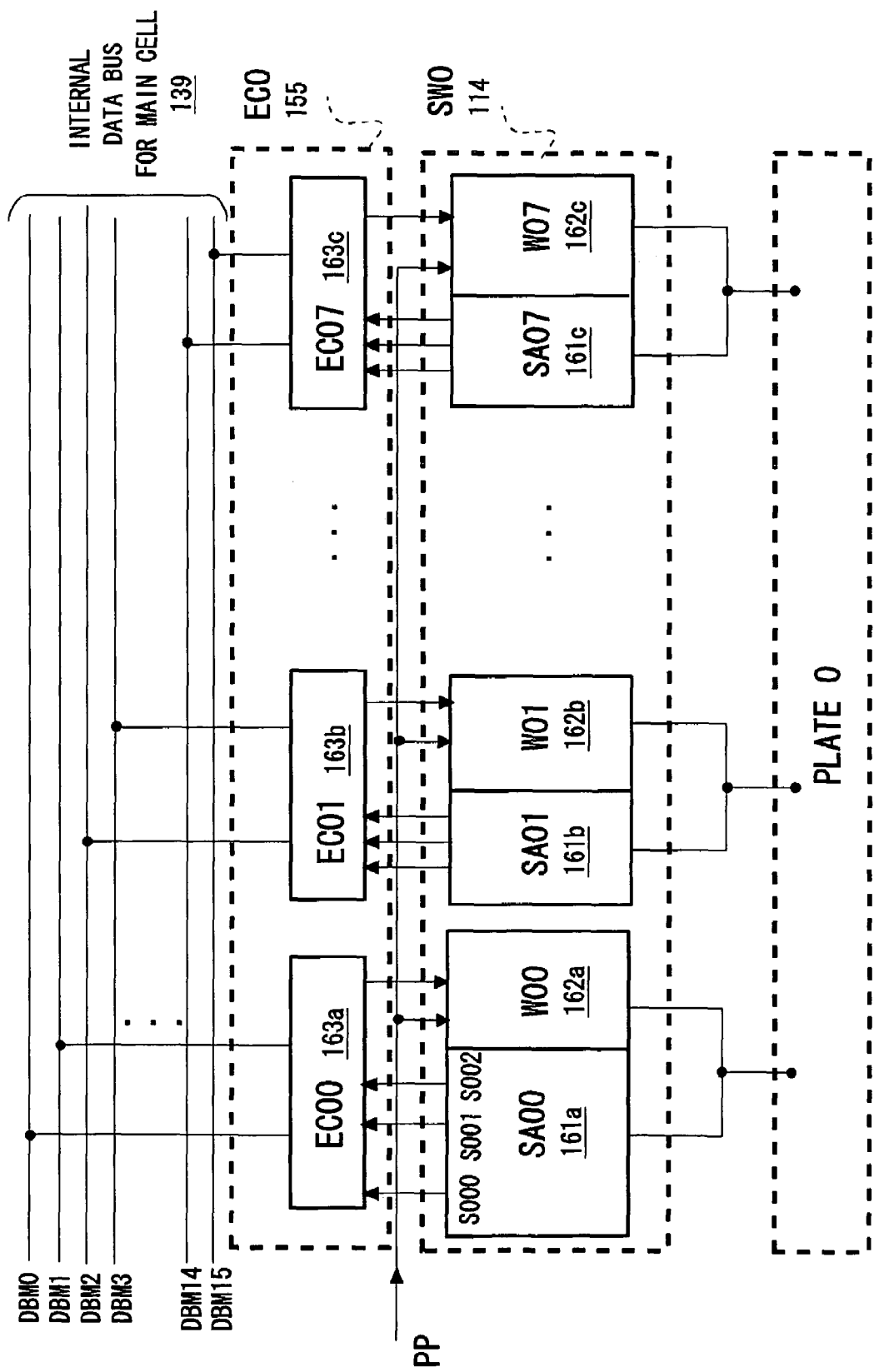
FIG. 8 is a block diagram showing the detailed configuration of the main cell field encoder circuit and the read/write circuits of the present embodiment.

FIG. 8 is a block diagram showing the detailed construction of the encoder circuit 155 and the read/write circuit 114 of the main cell field 112. The read/write circuit 114 and the encoder circuit 155 are provided for each plate which comprises a plurality of cells. The figure shows the circuits corresponding to plate 0. The read/write circuit 114 comprises eight cell read circuits (SA00-SA07) 161 assigned to each of the I/O fields, and eight cell write circuits (W00-W07) 162 assigned to each of the I/O fields.

The encoder circuit 155 comprises encoder circuit units (EC00-EC07) 163 which are assigned to each I/O field. During reading, each encoder circuit unit 163 encodes the output from the read circuit 161 and outputs to the main cell internal bus 139. During writing, the data from the main cell internal bus 139 is provided to a write circuit. For example, EC00 encodes the outputs of SA00 during reading and outputs data to the buses DBM0 and DBM1, and during writing, the data from DBM0 and DBM1 is output to W00. Note, PP represents the high-voltage signal supplied from the high-voltage generating circuit 130.

Figure 9:
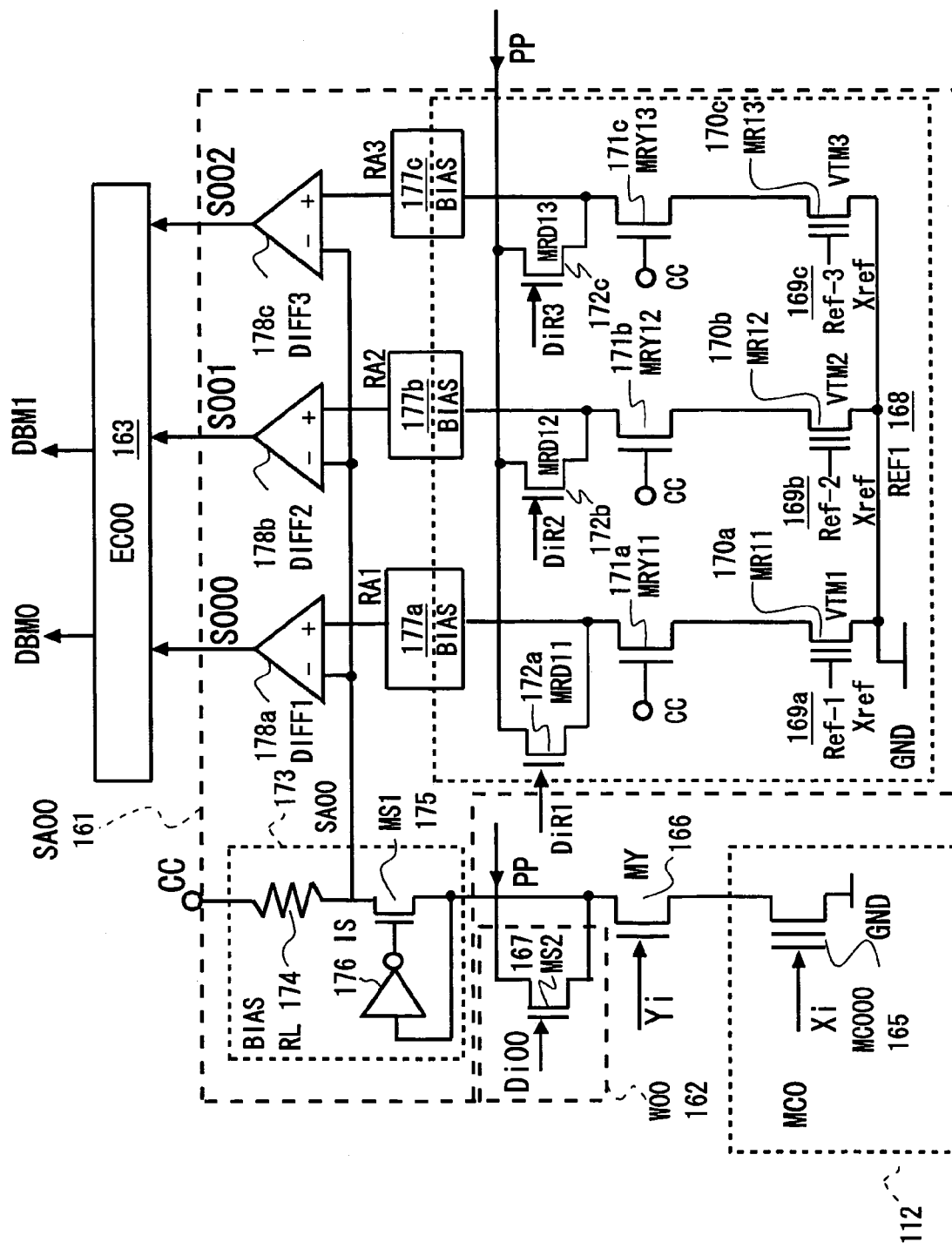
FIG. 9 is a circuit diagram showing the details of the cell read circuits (SA00) and write circuits (W00) of the present embodiment.

FIG. 9 is a circuit diagram showing the details of the cell read circuit (SA00) 161 and the write circuit (W00) 162. The memory cell (MC000) 165 is connected to the write circuit 162 through a cell selecting transistor (MY) 166. The write circuit 162 comprises a transistor (MS2) 167, and the high-voltage signal PP is input to the memory cell 165 through the transistor 167 which operates in accordance with a write input signal Di00 input to the transistor gate.

The cell read circuit 161 comprises a reference circuit (REF1) 168. The memory cell (MC000) 166 is a 4-value cell, so the reference circuit 168 comprises three reference circuit units (Ref-1, 2, 3) 169 with different threshold values. Each of the reference circuit units 169 comprises three reference cells (MR11, 12, 13) with different threshold values, and the threshold value of each cell is set to VTM1, VTM2, or VTM3, in order. The reference circuit unit 169 has the same construction as the memory cell 165 and the circuit components connected thereto, and comprises transistors (MRY11-13) 171 and transistors for data writing (MRD11-13) 172. A power source voltage CC is input to the gate of the transistor 171, and a write input signal DiR is input to the gate of the transistor 172. The high-voltage signal PP is input to each of the reference cells 170 through the transistor 172.

The read circuit 161 comprises a BIOS circuit 173 which provides BIOS support at startup for memory cell 165. The BIOS circuit 173 comprises a resistor (RL) 174, a transistor (MS1) 175 which is vertically connected to resistor 174, and an inverter (IS) 176 which is connected between the source and gate of the transistor 175. A BIOS circuit 177 of the same construction is connected to each of the reference circuit units 169.

The read signal from the memory cell 165 and each of the reference cells 170 is input to comparator detectors (DIFF1, 2, 3) 178 through the BIOS circuits 173, 177. Each of the comparator detectors (DIFF1, 2, 3) 178 compare the read signal SA00 with each of the read signals (RA1, 2, 3) from the reference cell 170. Each of the comparator detectors 178 outputs a signal (S000-S002) based on the comparison results.

Read Determination Circuit 127

Figure 10:
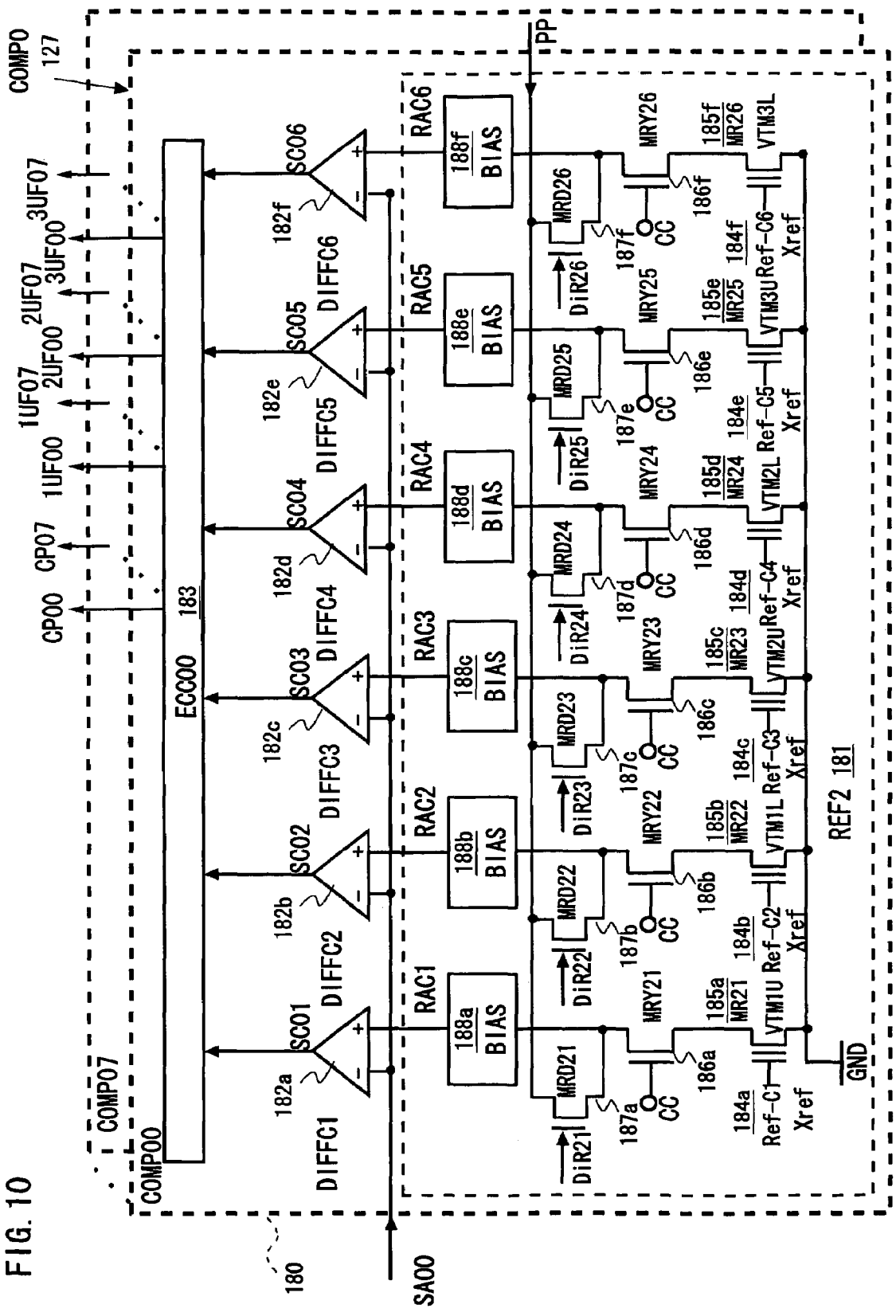
FIG. 10 is a diagram showing the circuit configuration of the read determination circuits of the present embodiment.

During the threshold voltage check of memory cell 165, the read signal SA00 from the memory cell 165 is input to a read determination circuit 127. The read determination circuit 127 determines whether or not the read signal SA00 from the memory cell 165 is within a specified range by comparing the read signal SA00 with a reference value. FIG. 10 shows the circuit components of the read determination circuit 127. In this embodiment, 16-bits (eight cells) of data are designated by one address, so the read determination circuit 127 comprises eight read determination circuit units (COMPQ0-07) with identical circuit components for each cell. The details of one of these read determination circuit units (COMP00) 180 will be described below. The read determination circuit unit 180 comprises a reference circuit (REF2) 180, comparator detectors (DIFFC1-6) 182, and an encoder (ECC00) 183.

As described in reference to FIGS. 1A-1B, read determination circuit unit 180 compares the read signal SA00 with 6 reference values. Therefore, the reference circuit 181 comprises six reference circuit units (Ref-C1-6) corresponding to each reference value. The basic configuration of the reference circuit unit 184 is essentially similar to the reference circuit unit 169 of the cell read circuit 161, and comprises reference cells (MR21-26) 185, transistors (MRY21-26) 186, write transistors (MRD21-26) 187, and a BIOS circuit 188.

The reference cells 185a-f are each set to have different threshold values, and are set to VTM1U, VTM1L, VTM2U, VTM2L, VTM3U, and VTM3L in order. The power supply voltage CC is input to the gate of each of the transistors 186. During data write, the high-voltage signal PP is input to each of the reference cells 185 through a write transistor 187 which is controlled by the data write input signal DiR. The construction of a BIOS circuit 188 is identical to the BIOS circuit 173 described with reference to FIG. 9, and has a function to provide BIOS support during start up.

The comparator detectors 182 each compare the read signals (RAC1-6) from the reference cell 185 with the read signal SA00. Specifically, each of the comparator detectors 182a-f successively and respectively compares signal SA00 and signal RAC1 and outputs signal SC01, compares signal SA00 and signal RAC2 and outputs signal SC02, compares signal SA00 and signal RAC3 and outputs signal SC03, compares signal SA00 and signal RAC4 and outputs signal SC04, compares signal SA00 and signal RAC5 and outputs signal SC05, and compares signal SA00 and signal RAC6 and outputs signal SC06.

Figure 11B:
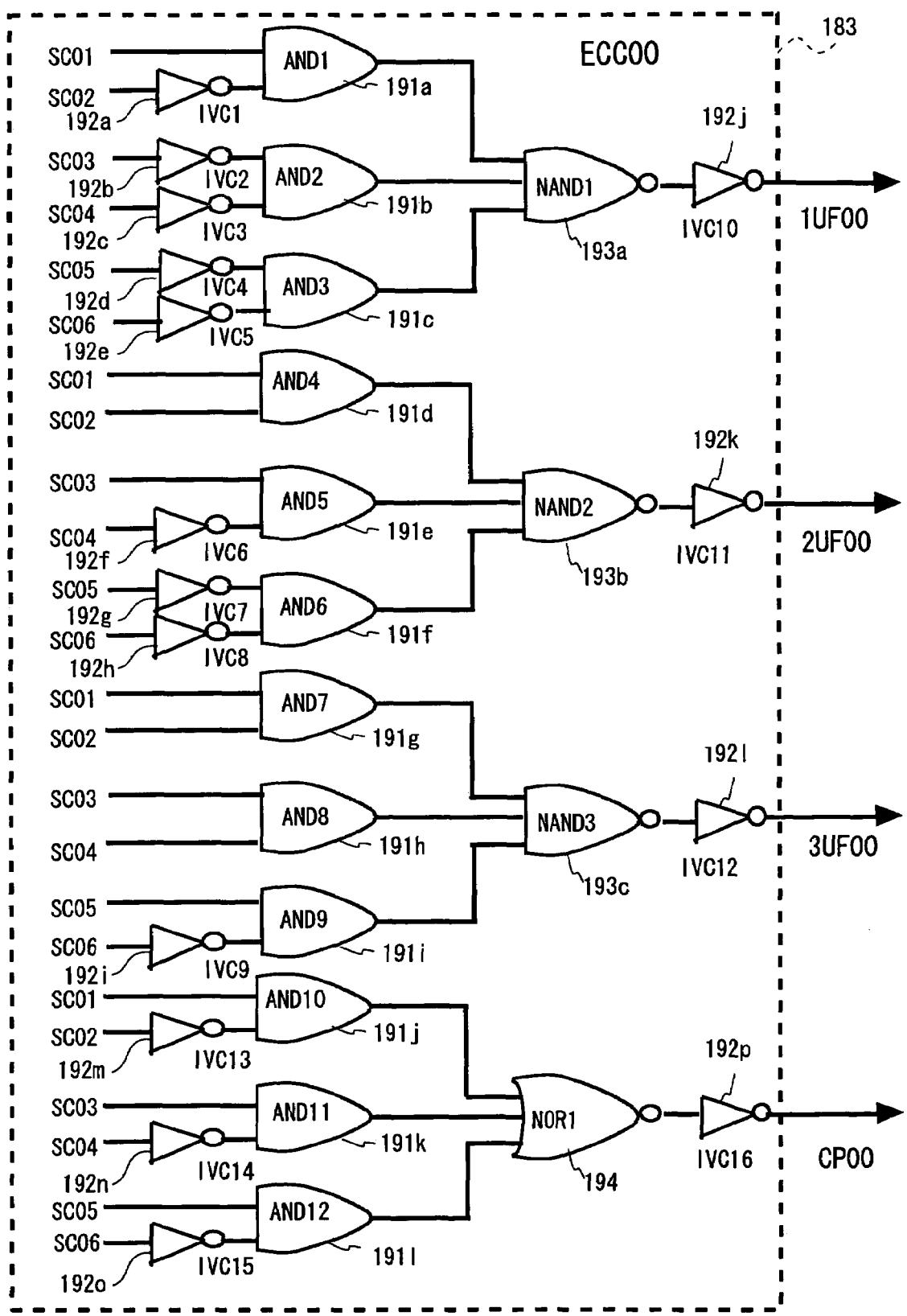

Each of the output signals (SC01-SC06) from the comparator detector 182 is input to the encoder 183. The encoder 183 determines the cell state of the memory cell from the output signals (SC01-SC06). FIGS. 11A-11B show the circuit configuration of the encoder 183 and the relationship between the output signal of the comparator detector 182 and the cell state of memory cell 165. As shown in the table of FIG. 11A, the cell state of the memory cell 165 can be specified by the combination of the logical level of the six output signals (SC01-SC06). The encoder 183 generates a signal which shows the cell state from the output signal of the comparator detector 182.

The specific circuit structure of the encoder 183 is shown in FIG. 11B. Encoder 183 comprises 12 two-input AND circuits (AND1-12) 191. Signal SC01 and signal SCO2 from inverter 192a are input to the AND1 circuit 191a. Signal SCO3 from inverter 192b and signal SC04 from inverter 192c are input to the AND2 circuit 191b. Signal SC05 from inverter 192d and signal SC06 from inverter 192e are input to the AND3 circuit 191c.

Signal SC01 and signal SC02 are input to AND4 circuit 191d. Signal SC03 and signal SC03 and signal SC04 from inverter 192f are input to AND5 circuit 191e. Signal SC05 from inverter 192g and signal SC06 from inverter 192h are input to AND6 circuit 191f.

Signal SC01 and signal SC02 are input to AND 7 circuit 191g. Signal SC03 and signal SC04 are input to AND8 circuit 191h. Signal SC05 and signal SC06 from inverter 192i are input to AND9 circuit 191i.

Signal SC01 and signal SC02 from inverter 192m are input to the AND10 circuit 91j. Signal SC03 and signal SC04 from inverter 192n are input to AND11 circuit 191k. Signal SC05 and signal SC06 from inverter 192o are input to AND12 circuit 1911.

The outputs from AND circuits 191a-c are input to NAND1 circuit 193a. Furthermore, the output signal from NAND1 circuit 193a is output as signal 1UF00 through inverter 192j. The outputs from AND circuits 191d-f are input to an NAND2 circuit 193b. Furthermore, the output signal from NAND2 circuit 193b is output as signal 2UF00 through inverter 192k. The output of AND circuits 191g-i are input to a NAND3 circuit 193c. Furthermore, the output signal from NAND3 circuit 193c is output as signal 3UF00 through inverter 192l. The output from AND circuits 191j-l are input to a NOR1 circuit 194. Furthermore, the output signal from NOR1 circuit 194 is output as signal CP00 through inverter 192p.

Signal CP00 shows whether the memory cell state is defective or not. If the cell state is at any of "a", "b", or "c", the signal CP00 will be at level H. If the cell state is normal, signal CP00 will be at level L. On the other hand, signals 1UF00-3UF00 show the defect details of the cell state. For instance, if the memory cell has an "a" state denoting a 00 defect, (1UF00, 2UF00, 3UF00) will be at levels (H, L, L). If the memory cell has an "b" state denoting a 01 defect, (1UF00, 2UF00, 3UF00) will be at levels (L, H, L). If the memory cell has an "c" state denoting a 10 defect, (1UF00, 2UF00, 3UF00) will be at levels (L, L, H).

Redundant Cell Activation Control Circuit 128

Figure 12:
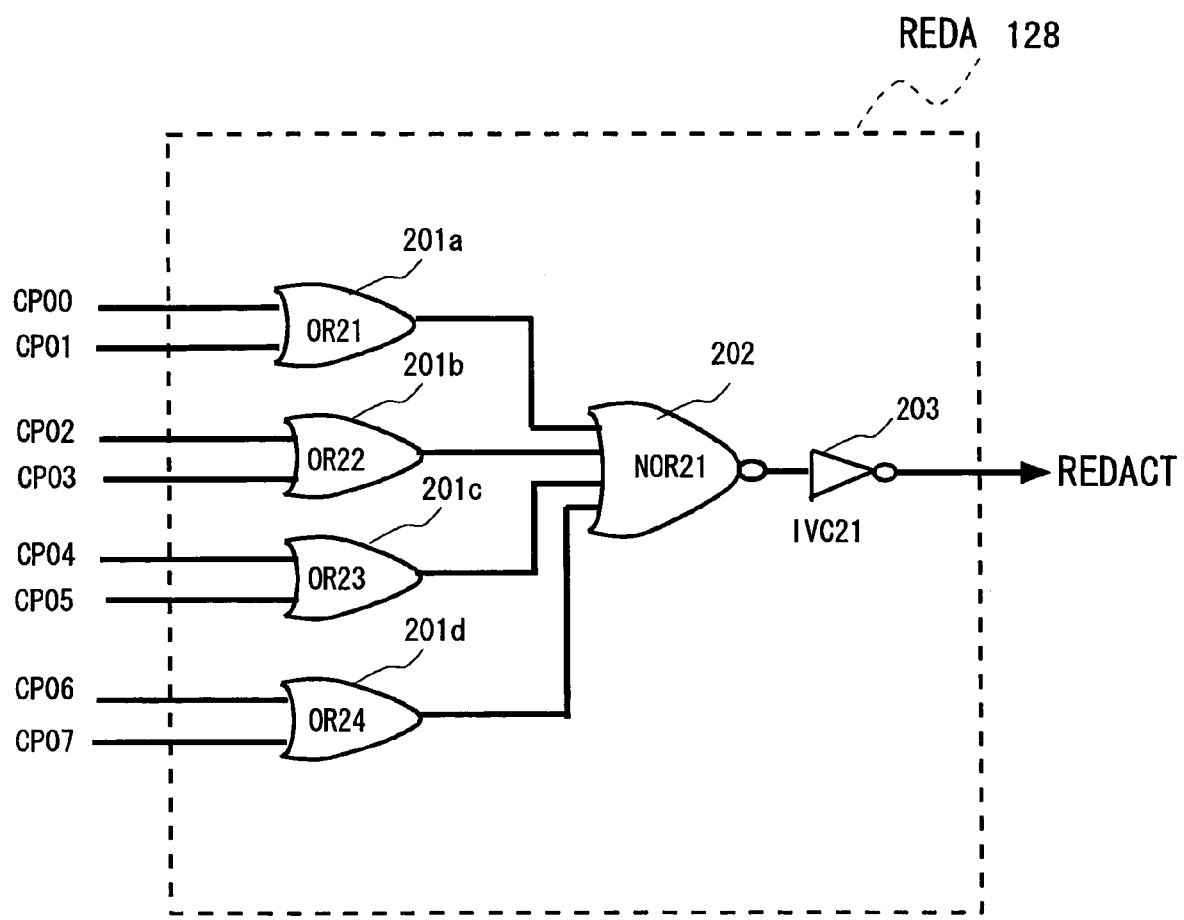
FIG. 12 is a diagram showing the circuit configuration of the redundant cell activation control circuit of the present embodiment.

The defective cell detection signals (CP00-CP07) from the read determination circuit 127 are input to the redundant cell activation control circuit (REDA) 128. The redundant cell activation control circuit 128 determines whether or not the inspected cell is a defective cell using the signals (CP00-CP07) FIG. 12 shows the circuit structure of the redundant cell activation control circuit 128. The redundant cell activation control circuit 128 has four OR circuits (OR21-23) 201. Each OR circuit 201 is a two input circuit and signals (CP00-CP07) are input.

Specifically, signals CP00 and CP01 are input to the AND21 circuit 201a. Signals CP02 and CPO3 are input to the AND22 circuit 201b. Signals CP04 and CP05 are input to the AND23 circuit 201c. Signals CP06 and CP07 are input to the AND24 circuit 201d. The outputs of each AND circuit 201 are input to the NOR21 circuit 202, and output through inverter IVC (21) 203 as the READACT signal.

Data Recovery Circuit 132

Figure 13:
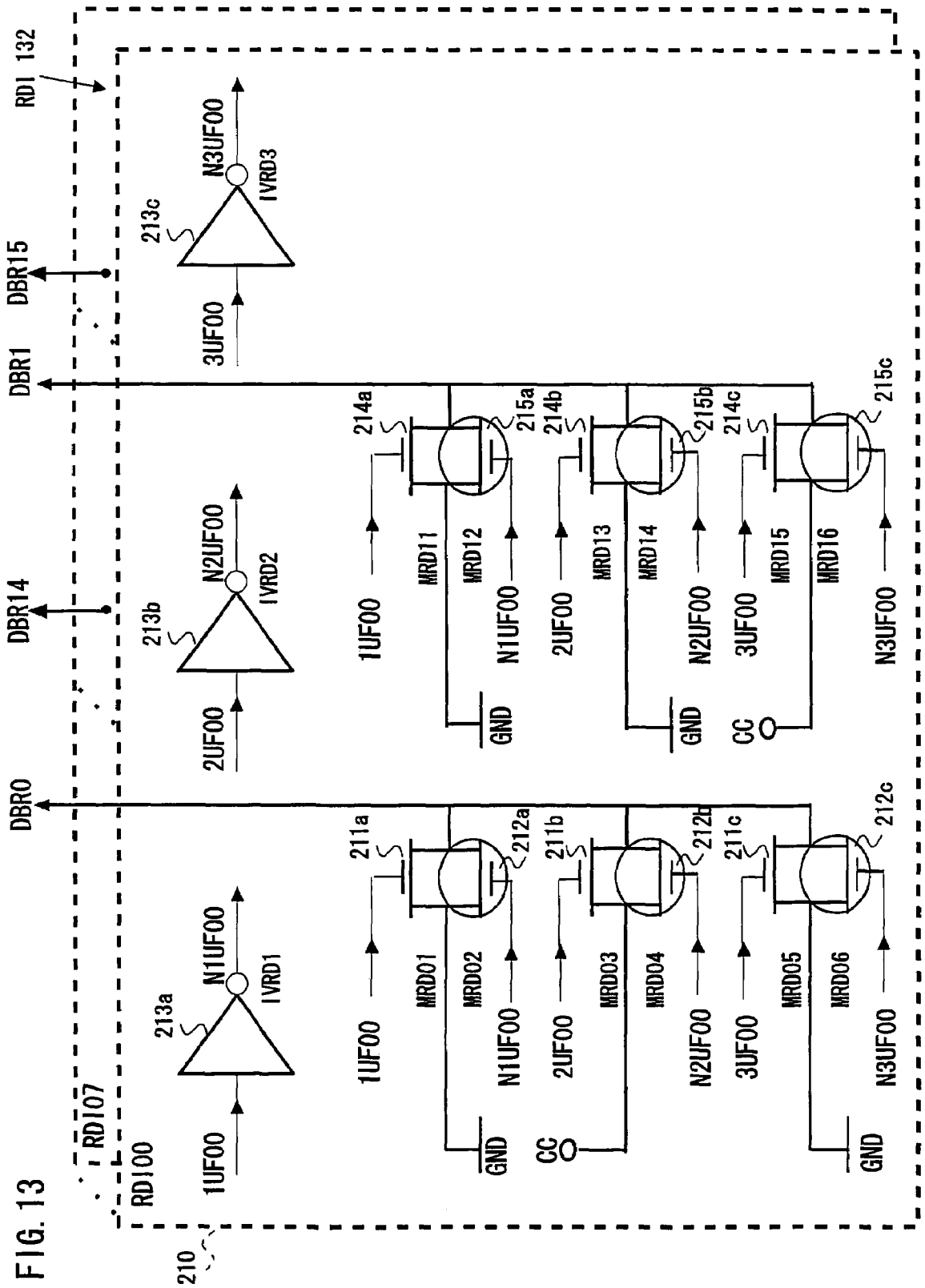
FIG. 13 is a diagram showing the circuit configuration of the data recovery circuit of the present embodiment.

The defective state designating signals (1UF00-3UF07) from the read determination circuit 127 are input to a data recovery circuit (RDI0) 132. The data recovery circuit 132 generates the original logical value data from the input signal. FIG. 13 shows the circuit configuration of the data recovery circuit 132. The data recovery circuit 132 comprises eight recovery circuit units (RDI00-RDI07) corresponding to eight cells of data. Each of the recovery circuit units has the same structure and the structure of recovery circuit units (RDI00) 210 will be described.

The memory cell 165 is a four-value cell, so the recovery circuit unit 210 outputs 2 bit data (DBR1, DBR0) based on the defective state designating signals (1UF00-3UF00). Note, DBR designates the redundant cell internal data bus, but in order to simplify the description, DBR will be used to represent the data output from the bus. In the recovery circuit unit 210, each of the signal lines of the 2 bit data is connected to the power source potential CC and the GND potential through a transistor. Each transistor is controlled by a defective state designating signal (1UF00-3UF00) and the electric potential based on the defective state designating signal (1UF00-3UF00) is supplied to each of the signal lines of the 2 bit data.

Specifically, the signal line of the signal DBR0 is connected to the GND potential through N type transistor (MRD01) 211a and P type transistor (MRD02) 212a, to the power source potential CC through N type transistor (MRD03) 211b and P type transistor (MRD04) 212b, and to the GND potential through N type transistor (MRD05) 211c and P type transistor (MRD06) 212c.

The N type transistor 211a and the P type transistor 212a are controlled by the signal 1UF00, the signal 1UF00 is input to the gate of the N transistor 211a, and the inverse signal N1UF00 of the signal 1UF00 is input to the P type transistor 212a through an inverter (INVRD1) 213a.

The N type transistor 211b and the P type transistor 212b are controlled by the signal 2UF00, the signal 2UF00 is input to the gate of the N type transistor 211b, and the inverse signal N2UF00 of the signal 2UF00 is input to the P type transistor 212b through an inverter (INVRD2) 213b.

The N type transistor 211c and the P type transistor 212b are controlled by the signal 3UF00, the signal 3UF00 is input to the gate of the N transistor 211c, and the inverse signal N3UF00 of the signal 3UF00 is input to the P type transistor 212c through an inverter (INVRD3) 213c. On the other hand, the signal line of the signal DBR1 is connected to the GND potential through N type transistor (MRD11) 214a and P type transistor (MRD12) 215a, to the GND potential through N type transistor (MRD13) 214b and P type transistor (MRD04) 215b, and to the power source potential CC through N type transistor (MRD05) 214c and the P type transistor (MRD06) 215c.

The N type transistor 214a and the P type transistor 215a are controlled by the signal 1UF00, the signal 1UF00 is input to the gate of the N transistor 214a, and the inverse signal N1UF00 of the signal 1UF00 is input to the P type transistor 215a through an inverter (INVRD1) 213a.

The N type transistor 214b and the P type transistor 215b are controlled by the signal 2UF00, the signal 2UF00 is input to the gate of the N transistor 214b, and the inverse signal N2UF00 of the signal 2UF00 is input to the P type transistor 215b through an inverter (INVRD2) 213b.

The N type transistor 214c and the P type transistor 215b are controlled by the signal 3UF00, the signal 3UF00 is input to the gate of the N transistor 214c, and the inverse signal N3UF00 of the signal 3UF00 is input to the P type transistor 215c through an inverter (INVRD3) 213c.

If the memory cell state is "a", signifying a 00 defect, then (1UF00, 2UF00, 3UF00) will be (H, L, L), so (DBR1, DBR0) will be (0, 0). If the memory cell state is "b", signifying a 01 defect, then (1UF00, 2UF00, 3UF00) will be (L, H, L), so (DBR1, DBR0) will be (0, 1). If the memory cell state is "c", signifying a 10 defect, then (1UF00, 2UF00, 3UF00) will be (L, L, H), so (DBR1, DBR0) will be (1, 0).

Redundant Cell Read/Write Circuit 118

Figure 14:
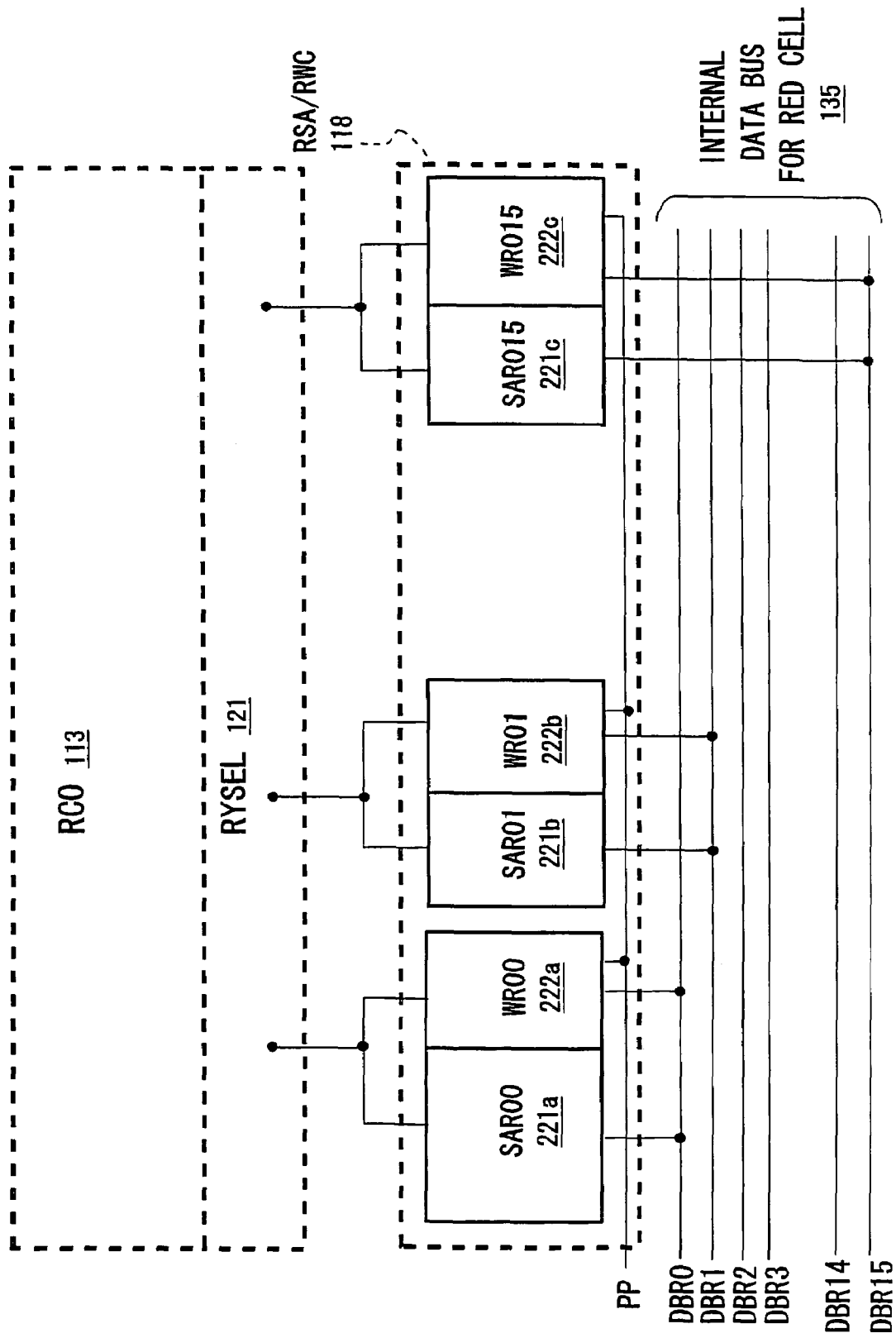
FIG. 14 is a block diagram showing the circuit configuration for the redundant cell read/write circuit of the present embodiment.

The corrected data which is output to the redundant cell internal bus is recorded by the redundant cell read/write circuit (RSA/RWC) 118 in the redundant cell field 113. FIG. 14 is a block diagram showing an outline of the circuit configuration of the redundant cell read/write circuit 118. The redundant cell read/write circuit 118 comprises read circuits (SAR00-015) 221 and write circuits (WR00-WR015) 222 corresponding to each of the 16 bits. The read circuits (SAR (k)) 221 and the write circuits (WR (k)) 222 are connected to the redundant cell internal bus 135 (DBR (k)).

Figure 15:
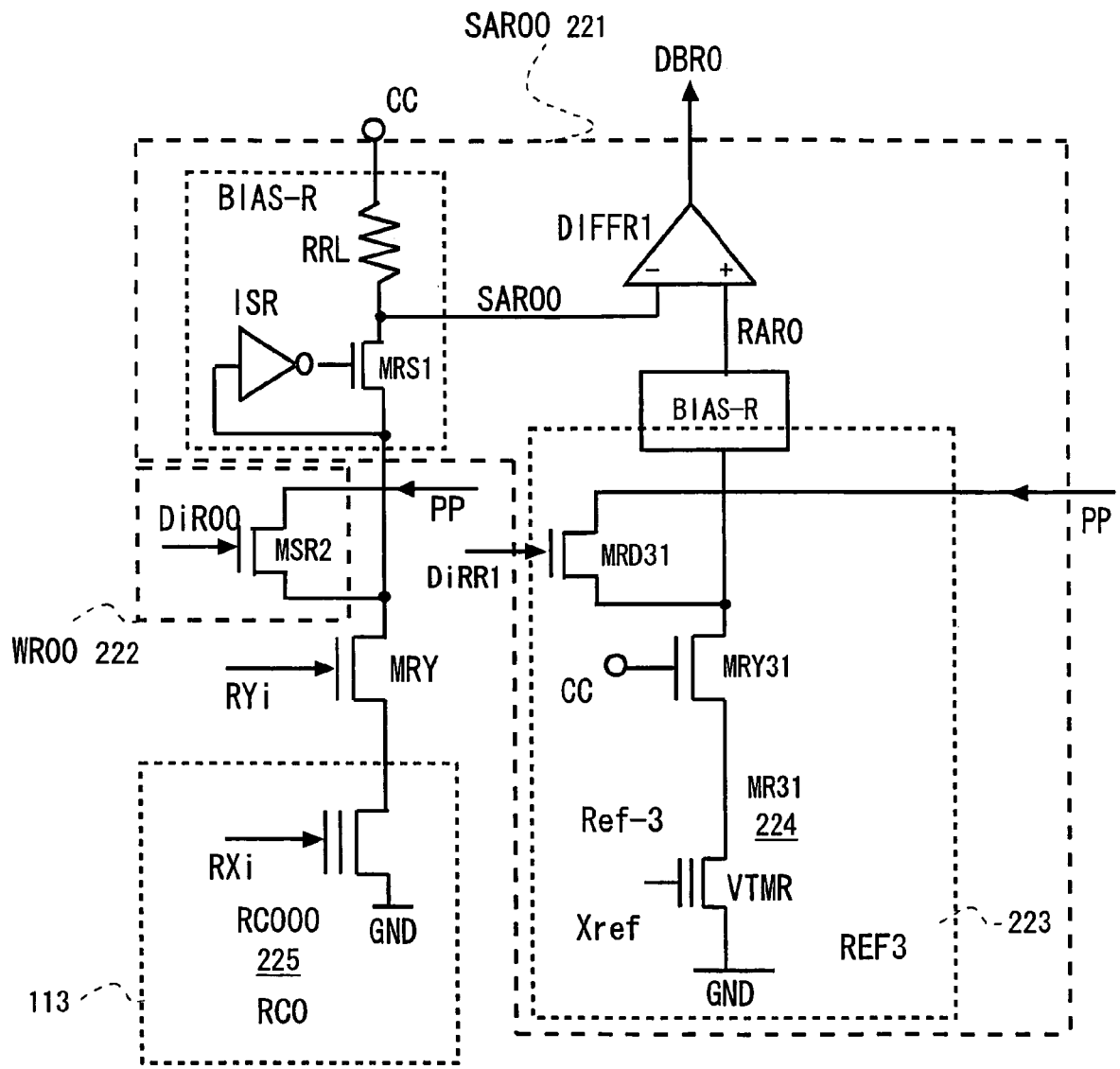
FIG. 15 is a diagram showing the circuit configuration for the read circuits and the write circuits of the present embodiment.

FIG. 15 shows the circuit configuration of read circuits (SAR00) 221 and write circuit (WR00) 222. All of the circuit configurations are essentially the same as the read circuit 161 and the write circuit 162 described in reference to FIG. 9. The redundant cells are not multi-value cells, so reference circuit (REF3) 223 compares the reference cell (MR31) 224 which has a single reference value VTMR with redundant cell (RC000) 225.

Figure 16:
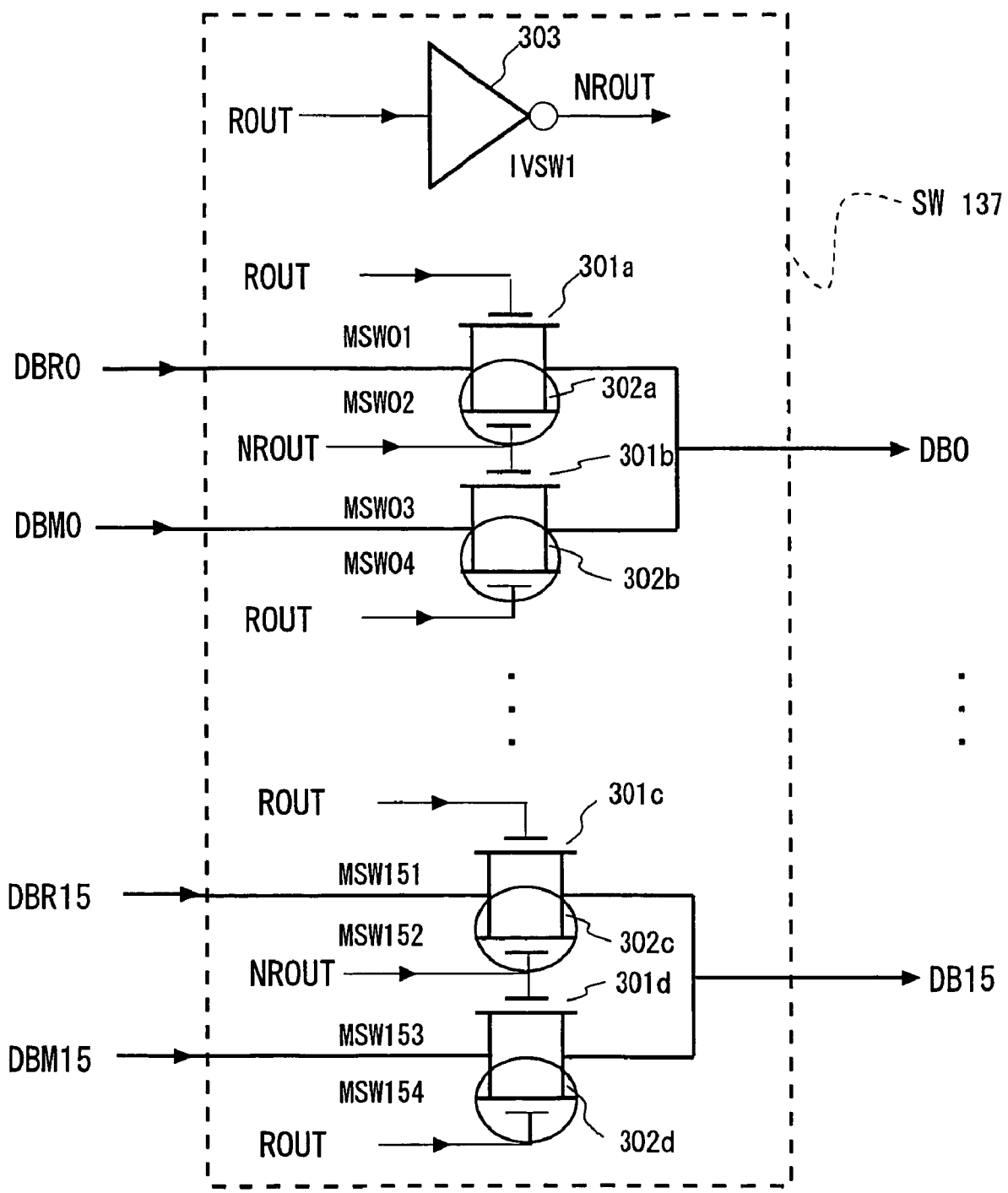
FIG. 16 is a diagram showing the circuit configuration of the bus switching circuit of the present embodiment.

The data read from redundant cell field 113 is transferred by the redundant cell internal bus 135 and output externally through the bus switching circuit (SW) 137. FIG. 16 shows the circuit configuration of bus switching circuit 137. Bus switching circuit 137 switches the bus which is connected to the input-output data bus (DB) 138 according to a control signal ROUT. If the control signal ROUT is H, the data of the redundant cell internal bus 135 will be output to the input/ output data bus 138. If the control signal ROUT is L, the data from the main cell internal bus 139 will be output to the input/output data bus 138.

In reference to FIG. 16, each bus of the input/output data bus 138 is connected to each bus of the redundant cell internal bus 135 and each bus of the main cell internal bus 139. By controlling the transistor using the control signal ROUT, the bus connected to the input/output data bus 138 can be selected. An embodiment of the input/output data bus (DB0) will be described. The input/output data bus (DB0) is connected to the redundant cell internal bus (DBR0) through an N type transistor (MSW01) 301*a* and a P type transistor (MSW02) 302*a*, and is connected to the main cell internal bus (DBM0) through an N type transistor (MSW03) 301*b* and a P type transistor (MSW04) 302*b*.

The control signal ROUT is input to the gates of the N type transistor 301*a* and the P type transistor 302*a*, and the control signal NROUT which is inverted by an inverter circuit (IN-VSW1) 303 is input to the gates of the P type transistor 302*a* and a N type transistor 301*b*. Therefore, when control signal NROUT is H, the data from the redundant cell internal bus (DBR0) will be carried on the input/output data bus (DB0). The other 15 buses are identical.

It is apparent that the present invention is not limited to the above embodiment, that may be modified and changed without departing from the scope and spirit of the invention. For example, the present invention is described above using a flash memory embodiment, but for instance, the present invention can also be applied to other types of memory devices such as FeRAM or the like. For instance, with FeRAM, polarization characteristics will be measured in place of the threshold value of the flash memory in order to determine a defective cell.

What is claimed is:

1. A nonvolatile memory comprising:
   a nonvolatile memory cell array having plural sectors storing data, a first one of said plural sectors being accessed with an external address and in which a read/write operation is being conducted;
   an internal address generation circuit generating an internal address for a second one of said plural sectors other than said first one of said plural sectors and in which a read/write operation is not being conducted, said internal address being different from the external address;
   a check circuit performing a check process comprising detection and determination of state of a cell in said second one of said plural sectors during the read/write operation in said first one of said plural sectors, said check circuit not performing the check process in said first one of said plural sectors during the read/write operation therein; and
   a redundant cell storing data of the selected cell if the check circuit determines that the cell state is within a predetermined range.

2. The nonvolatile memory of claim 1, wherein the read/write operation is a writing process comprising data programming to the first one of said plural sectors, and the check circuit detects and determines the cell state during the writing process.

3. The nonvolatile memory of claim 2, wherein the writing process further comprises a data erasing process.

4. The nonvolatile memory of claim 1, wherein the check circuit detects a threshold value of the cell and determines whether the threshold value is within a predetermined range.

5. The nonvblatile memory of claim 2, wherein the check circuit performs the check process every said writing process.

6. The nonvolatile memory of claim 1, further comprising a counter circuit counting read commands for the memory cell array, and wherein the check circuit detects and determines the state of the cell selected according to the internal address on condition that a count number of the read command from a preceding check process reaches a predetermined value.

7. The nonvolatile memory of claim 1, further comprising a counter circuit counting read commands for the memory cell array, and wherein the check performs the check process on condition that a count number of the read command from a preceding check process reaches a predetermined value.

8. The nonvolatile memory of claim 1, further comprising a counter circuit counting read commands and write commands for the memory cell array, and wherein the check circuit performs the check process on condition that one of count numbers of the read command and the write command from a preceding check process reaches a predetermined value.

9. The nonvolatile memory of claim 1, wherein the check circuit completes the check processing for all cells in a sector in a single check cycle.

10. The nonvolatile memory of claim 1, further comprising:
    a memory circuit storing an address of the one of the plural sectors of the memory cell array of which data is stored in a redundant cell, and
    a comparing circuit comparing an address stored in the memory circuit and an address corresponding to a read command for the one of the plural sectors of the memory cell array, wherein
    data stored in the redundant cell is read out responsive to the read command if the comparison result of the comparing circuit indicates a match.

11. The nonvolatile memory of claim 10, wherein the memory circuit resets the stored address in response to a write command for the stored address.

12. The nonvolatile memory of claim 1, wherein the check circuit performs the check processing in response to being powered on.

13. The nonvolatile memory of claim 1, wherein the check circuit performs the check processing in response to activation of the nonvolatile memory by a selection signal.

* * * * *